United States Patent
Kim et al.

(10) Patent No.: US 6,829,157 B2
(45) Date of Patent: Dec. 7, 2004

(54) METHOD OF CONTROLLING MAGNETIZATION EASY AXIS IN FERROMAGNETIC FILMS USING VOLTAGE, ULTRAHIGH-DENSITY, LOW POWER, NONVOLATILE MAGNETIC MEMORY USING THE CONTROL METHOD, AND METHOD OF WRITING INFORMATION ON THE MAGNETIC MEMORY

(75) Inventors: Sang-Koog Kim, Seoul (KR); Sung-Chul Shin, Daejeon (KR); Kwangsoo No, Daejeon (KR)

(73) Assignees: Korea Institute of Science and Technology, Deajeon (KR); Seoul National University, Seoul (KR)

( * ) Notice: Subject to any disclaimer, the term of this patent is extended or adjusted under 35 U.S.C. 154(b) by 48 days.

(21) Appl. No.: 10/288,613

(22) Filed: Nov. 5, 2002

(65) Prior Publication Data

US 2003/0103371 A1 Jun. 5, 2003

(30) Foreign Application Priority Data

Dec. 5, 2001 (KR) .................................. 10-2001-0076719
Aug. 8, 2002 (KR) .................................. 10-2002-0046734

(51) Int. Cl.$^7$ ................................................ G11C 11/00
(52) U.S. Cl. ...................... 365/157; 365/145; 365/158; 365/171
(58) Field of Search ............................. 365/157, 145, 365/158, 171

(56) References Cited

U.S. PATENT DOCUMENTS

| | | | |
|---|---|---|---|
| 4,780,848 A | 10/1988 | Daughton et al. | |
| 5,343,422 A | 8/1994 | Kung et al. | |
| 5,734,605 A | 3/1998 | Zhu et al. | |
| 5,902,690 A | 5/1999 | Tracy et al. | |

OTHER PUBLICATIONS

An article entitled, "Advanced MRAM Concept", By James M. Daughton, published 2001, pp. 1–6.

An article entitled, "Mag netoresistive Random Access Memory (MRAM)", By James Daughton, published 2000, pp. 1–13.

*Primary Examiner*—Richard Elms
*Assistant Examiner*—Pho M. Luu
(74) *Attorney, Agent, or Firm*—Bachman & LaPointe, P.C.

(57) ABSTRACT

A method of controlling a magnetization easy axis of a ferromagnetic film, an ultrahigh-density, low power, nonvolatile magnetic memory using the control method, and a method of writing information on the magnetic memory. The method includes the step of arranging an electrode layer, a piezoelectric layer and a magnetic layer in a layered structure. Voltage is applied to the electrode layer to generate an electric field. Thereafter, lattice change is caused in the piezoelectric layer using the generated electric field. A magnetization easy axis of the magnetic layer is reversibly switched between in-plane and out-of-plane by exerting stress generated by the lattice change onto the magnetic layer.

7 Claims, 13 Drawing Sheets

METHOD OF CONTROLLING MAGNETIZATION EASY AXIS IN FERROMAGNETIC FILMS USING VOLTAGE, ULTRAHIGH-DENSITY, LOW POWER, NONVOLATILE MAGNETIC MEMORY USING THE CONTROL METHOD, AND METHOD OF WRITING INFORMATION ON THE MAGNETIC MEMORY

BACKGROUND OF THE INVENTION

1. Field of the Invention

The present invention relates generally to a method of controlling a magnetization easy axis in ferromagnetic films using voltage, an ultrahigh-density, low power, nonvolatile magnetic memory using the control method, and a method of writing information on the magnetic memory.

More particularly, the present invention relates to a method of controlling the spin directions of ferromagnetic films using an inverse magnetostrictive effect by applying voltage to a piezoelectric film instead of applying a magnetic field and so exerting tensile or compressive stress on magnetic films, and a method of writing information on a Magnetic Random Access Memory (MRAM) using voltage to put the nonvolatile, high density, low power magnetic memory to practical use.

2. Description of the Prior Art

Recently, a key issue in the field of information storage technology is the implementation of an ideal nonvolatile information storage device. Promising candidates for the implementation of such an ideal nonvolatile information storage device are a Ferroelectric Random Access Memory (FeRAM) using the high-charge spontaneous dipole phenomenon of a ferroelectric film and a Magnetic Random Access Memory (MRAM) using a spin polarization phenomenon. The MRAM is a nonvolatile magnetic memory device that can compare with the FeRAM having both the advantage of rapid speed of a Static Random Access Memory (SRAM) and the advantage of high density of a Dynamic Random Access Memory (DRAM).

In spite of having the great advantage of non-volatility, the MRAM has a difficulty in realizing ultrahigh integration in that it is difficult to localize an external magnetic field with its sufficient strength when spacing between cells is reduced and so the deletion of information may be caused by interaction between the spins of cells. In magnetization direction control by applying a magnetic field, the localization of the magnetic field becomes difficult in inverse proportion to the size of the cell when the spin direction of each cell is switched to store information. That is, when a conventional spin switching driving method using a magnetic field is employed, there occurs a problem in writing information on an ultrahigh density integrated memory in which the size of cells and spacing between the cells are reduced. This is because the applied magnetic field affects neighboring cells that do not need to be spin switched, so recorded bits may be deleted. Additionally, stored spin directions, that is, information, may be deleted by interaction between the spins of cells. Accordingly, for the ultrahigh density MRAM, it is essential to control spontaneous magnetization directions without applying a magnetic field through current along a metal wire, and it is necessary to eliminate an interference effect caused by interaction between recorded spin directions. Further, in the conventional MRAM technology, the relative spin directions of fixed and free magnetic films are read by using the magnetoresistance effect of tunneling electrons passing through an insulating film layer that separates the two ferromagnetic films from each other, so the thickness of the insulating film must be less than about 1 nm. It is difficult to deposit the insulating film having a regular thickness of 1 nm onto a wafer having a radius of several inches, so it is a significant shortcoming of the conventional MRAM device.

Recently, challenging attempts have been made to control magnetization directions by applying current instead of using an applied magnetic field according to a conventional method. One of these attempts is the prediction of spin switching in a complicated layered structure of ferromagnetic/metallic spacer/insulator/ferromagnetic, which is possibly caused by controllable exchange coupling, but is not experimentally proven yet (refer to You, C. Y. & Bader S. D., Prediction of switching rotation of the magnetization direction with applied voltage in a controllable interlayer exchange coupled system, J. Magn. Magn. Mater. 195, 488–500 (1999)). Another attempt is the experimental demonstration of current-induced switching of spin directions in Co/Cu/Co sandwich structures, and such phenomenon is ascribed to local exchange interactions between flowing conduction electrons and magnetization (refer to Myers, E. B., Ralph, D. C., Katine, J. A., Louie, R. N. & Buhrman, R. A., Current-Induced Switching of Domains in Magnetic Multilayer Devices, Science 285, 867–870 (1999)). However, the latter case has a problem in that current to induce spin switching is usually used for measuring Giant Magnetoresistance (GMR) as well.

SUMMARY OF THE INVENTION

Accordingly, the present invention has been made keeping in mind the above problems occurring in the prior art, and an object of the present invention is to provide a method of controlling spontaneous magnetization directions in ferromagnetic films operated at room temperature by using voltage, and more particularly a voltage-driven spin switching method in a hybrid system of piezoelectric/magnetic films using inverse magnetostrictive and inverse piezoelectric effects, and a method of writing information on a nonvolatile magnetic memory, such as a MRAM, in which 128 or more Mbit ultrahigh integration is implemented.

Another object of the present invention is to provide a magnetic memory that is advantageous in that an insulating thin film having a thickness of about 1 nm is not employed, thus eliminating the difficulty of manufacturing and improving the yield of manufacturing.

A further object of the present invention is to provide a method of writing information on a magnetic memory, which uses a magnetization easy axis and so vertical and horizontal relative spin directions instead of using opposite spin directions on a single magnetization easy axis, so stable information storage function is provided, thus overcoming the deletion of information caused by a superparamagnetism effect that occurs when the size of cells is reduced.

In order to accomplish the above object, the present invention provides a method of controlling a magnetization easy axis of a ferromagnetic film, comprising the steps of arranging an electrode layer, a piezoelectric layer and a magnetic layer in a layered structure; applying voltage to the electrode layer to generate an electric field, wherein the electric field causes a lattice change (expansion or compression) in the piezoelectric layer, and stress (tensile stress or compressive stress) onto the magnetic layer induced by the lattice change yields a switching of the magnetization easy axis between in-plane and out-of-plane in a reversible way.

In accordance with another feature of the present invention, the piezoelectric layer is comprised of any one selected from the group consisting of PZT, PLZT, BLT and SBT which is tolerant of fatigue.

In accordance with another feature of the present invention, the piezoelectric layer has a thickness equal to or less than 100 nm, and charge dipole polarization is generated at less than several volts when voltage is vertically applied, so a nonvolatile, low power memory device on which information can be written with low voltage can be manufactured. In the case where the piezoelectric layer has a thickness equal to or less than 50 nm, a very low power memory device having a drive voltage of less than 1 volt can be manufactured.

In accordance with an additional feature of the present invention, a magnetic element constituting the magnetic layer is comprised of a CoPd alloy. Alternately, the magnetic element may be comprised of a CoFe and NiFe alloy, or ternary alloy comprised of Ni, Fe and Co to achieve great electrostriction and magnetoresistance characteristics. Also, a non-magnetic element among Pd, Pt, Au, Cu, Ru, W may be added to the alloy.

In accordance with an additional feature of the present invention, the electrode layer comprises metallic electrode lines made of any one selected from the group consisting of Pt, Pd, Cu, Al, Ru and W.

In accordance with an additional feature of the present invention, a nonvolatile, ultrahigh density, low power magnetic memory using a method of controlling the spin directions of a ferromagnetic film comprises a memory cell array, which includes a piezoelectric layer comprised of a piezoelectric element; a free magnetic layer disposed on the piezoelectric layer, wherein a magnetization easy axis is reversibly switched between in-plane and out-of-plane by stress induced by the piezoelectric layer applied voltage; a fixed magnetic layer which is disposed on the free magnetic layer and whose magnetization axis is fixed; and a nonmagnetic layer interposed between the free magnetic layer and the fixed magnetic layer to suppress magnetic interaction between the two magnetic layers.

In accordance with an additional feature of the memory device of the present invention, the memory cells are connected to one another by perpendicular metallic electrode lines, and the magnetization easy axis of the free magnetic layer is switched by applying voltage to the metallic lines connected to the memory cells when information is written in memory cells.

In accordance with an additional feature of the memory device of the present invention, information is read out by reading the relative spin directions of the free and fixed magnetic layers in such a way as to apply current to the metallic electrode lines and read the magnetoresistance value of the free and fixed magnetic layers, that is, a magnetoresistance value between vertically and horizontally arranged spins.

In accordance with an additional feature of the memory device of the present invention, the spin directions are determined by vertical and horizontal magnetization easy axes, so the spin directions are free from interaction between the spins of the cells.

In accordance with an additional feature of the memory device of the present invention, the spin directions of the spin-fixed layer and the spin-free layer are determined by magnetization easy axes, so the magnetization easy axes can be maintained under a superparamagnetism effect, which is generated when the size of the cells is reduced, by strong magnetic anisotropy caused by stress, and the deletion of information can be suppressed.

In accordance with an additional feature of the memory device of the present invention, when voltage is applied in a vertical direction of the memory cell plane, diagonal metallic electrode lines are additionally arranged, and information is read out by applying current to the diagonal and horizontal metallic electrode lines connected the memory cells. In this case, 3 metallic lines are necessary for writing and reading information.

In accordance with an additional feature of the magnetic memory of the present invention, each of the metallic electrode lines is divided into a path for applying voltage and a path for applying voltage by an insulator so as to prevent the flow of current through the magnetic layers when the voltage is applied in a horizontal direction of the memory cell plane.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

The present invention utilizes a hybrid system of piezoelectric/magnetic films. One of the most important requirements for the implementation of low voltage-driven spin switching using a piezoelectric/magnetic hybrid system is the switchability of magnetization directions by controlling a small amount of change in the internal strain of a magnetic layer. The inverse magnetostrictive effect of the magnetic layer makes this possible since a piezoelectric layer, which has a significant electric field-driven lattice change due to permanent dipoles of positively and negatively charged ions, can induce sufficient stress on the magnetic layer. As materials satisfying these requirements, an ultra-thin CoPd. (cobalt-palladium) alloy film and PZT (lead-zirconate-titanate) are chosen as the magnetic layer and the piezoelectric layer, respectively. The former is known to have a large inverse magnetostrictive effect, that is, a significant change in magnetization directions in response to applied stress, whereas the latter is known to have a considerable piezoelectricity and inverse electrostrictive effect. Additionally, PLZT, BLT, SBT and $LiNbO_3$ can be used as the piezoelectric layer, and AB (A designates Co, Ni, Fe or the like, B designates Pd, Pt, Au, Cu or the like), ternary or more alloy line materials, such as Co, Fe, Ni, Pd, Pt, Au, Cu, or TbFeCo line element can be used as the magnetic layer.

Hereinafter, embodiments and examples of the present invention are described with reference to the accompanying drawings.

Figure 1A:
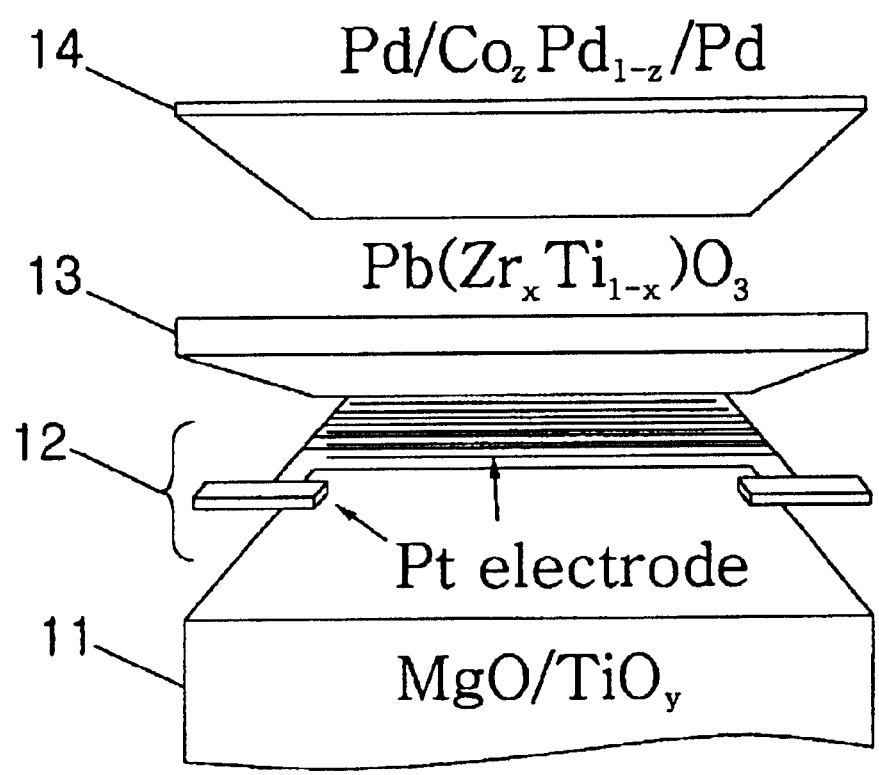
FIG. 1a is a design drawing of piezoelectric/magnetic/electrode hybrid system to which a method of controlling a magnetization easy axis using voltage according to the present invention is applied.

FIG. 1a is an exploded perspective view showing a hybrid system of piezoelectric/magnetic films in which $TiO_y$ is deposited on an MgO substrate, a $Pb(Zr_xTi_{1-x})O_3$ layer 13 is arranged on the $TiO_y$-deposited MgO substrate 11 with patterned Pt electrode 12 interposed therebetween, and a $Pd/Co_zPd_{1-z}/Pd$ layer 14 is arranged on the $Pb(Zr_xTi_{1-x})O_3$ layer 13. A method of spin-switching of a ferromagnetic film is implemented by the hybrid system that is comprised of a piezoelectric layer and a magnetic layer. As described above, a PZT may be employed as a piezoelectric element constituting the piezoelectric layer while a CoPd alloy film may be employed as a ferromagnetic element constituting the magnetic layer. In order to obtain sufficiently large electric field between the neighboring Pt electrodes 12 by the application of low voltage, microscale-patterned Pt electrodes are employed as the Pt electrodes 12, so a sufficient electrostrictive effect is generated at a given voltage. In the hybrid system, a plurality of layers are disposed with one on top of another in the order of a MgO substrate and a $TiO_y$ layer 11, Pt electrode lines each having a thickness of 50 nm, a width of 5 μm and a spacing of 5 μm and Pt pads 12, a $Pb(ZrxTi_{1-x})O_3$ layer having a thickness of 100 nm 13, and a $Pd/Co_zPd_{1-z}/Pd$ layer 14. Such patterned Pt electrodes 12 are designed to achieve alternate charge polarization when sufficient voltage is applied.

Figure 1B:
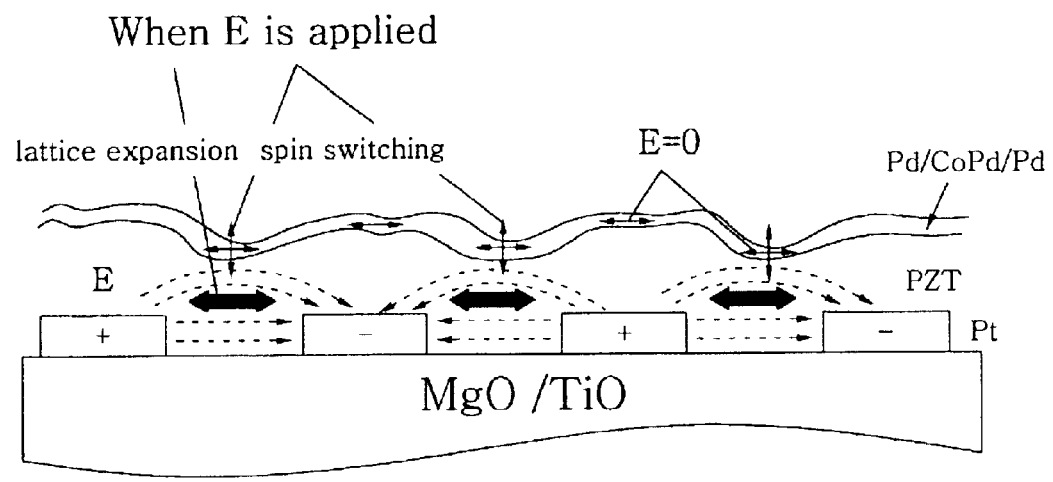
FIG. 1b is a diagram showing the cross sections of Pt electrodes and the concept of magnetization easy axis switching caused by an applied electric field(E)

FIG. 1b is a diagram showing the cross sections of Pt electrodes and a spontaneous spin switching concept, wherein the dotted arrows designate directional electric field lines. When an electric field is zero, a spin direction resides on the plane of a film. This is due to typical film shape anisotropy caused by dipole-dipole interaction. In contrast, when a certain electric field is applied, the lattice expansion of the PZT layer caused by the considerable electrostriction of the PZT layer and tensile stress generated in the CoPd alloy layer follow. As a result, the inverse magnetostrictive effect of the magnetic CoPd alloy film causes a magnetization easy axis to be displaced from in-plane to out-of-plane, thus causing spin direction switching. In this case, the texture of the CoPd alloy film is a (111) plane, and has a negative magnetostriction constant of about $-10^{-4}$.

Figure 1C:
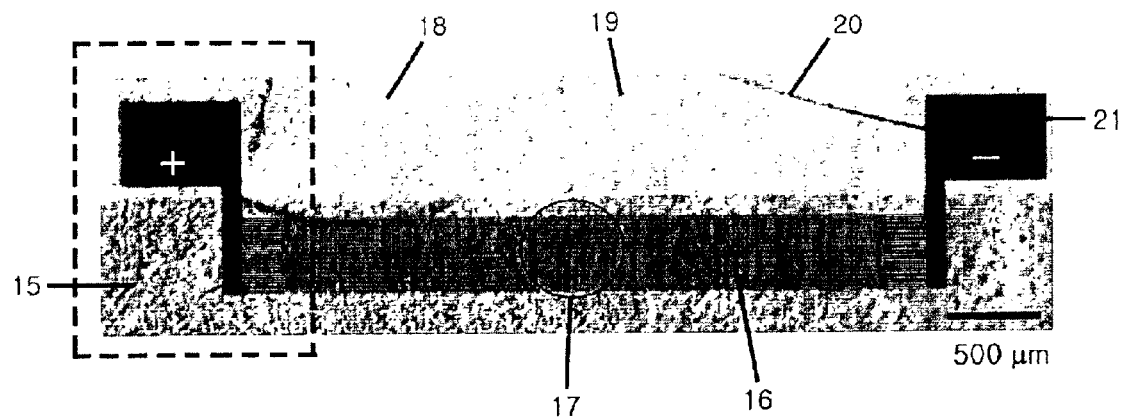
FIGS. 1c, 1d and 1e are microscopic plan views of the hybrid system of the present invention.
Figure 1D:
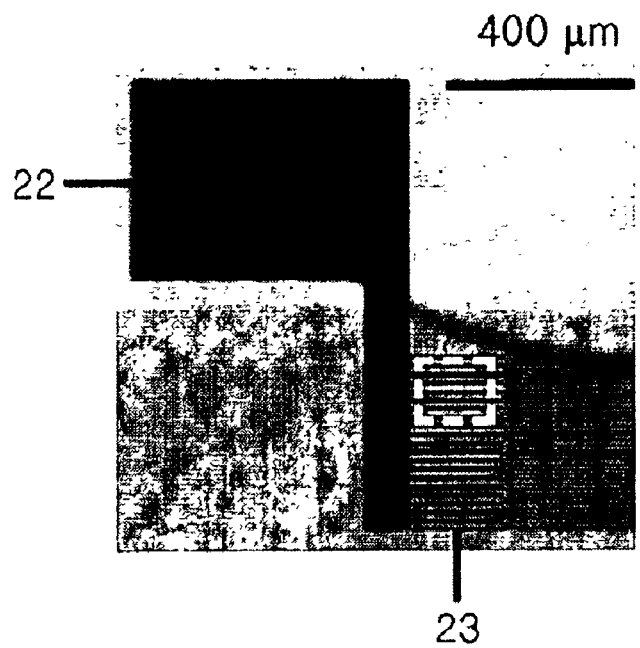
Figure 1E:
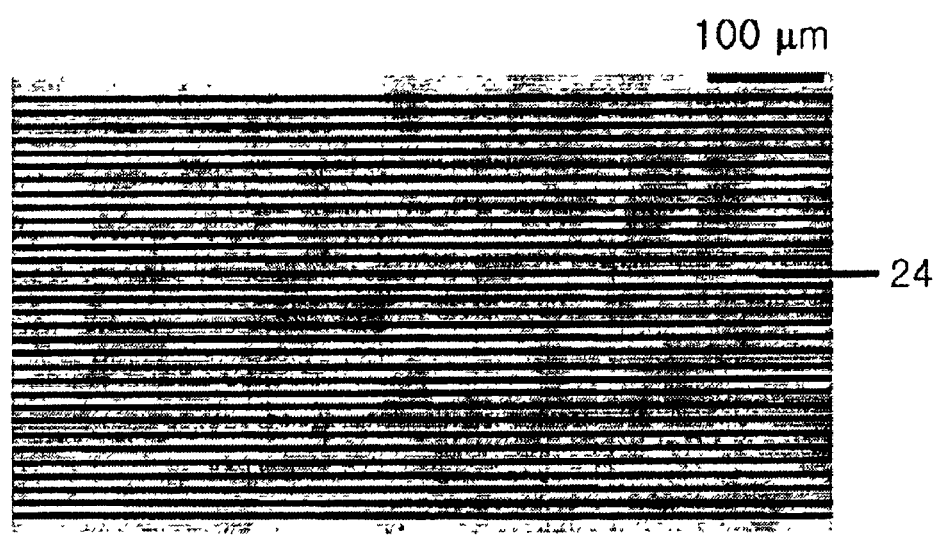

FIGS. 1c, 1d and 1e are microscopic plan views of the hybrid system to which the spin switching drive method of the present invention is applied. In these drawings, the above-described layered structure is well illustrated, and different scales are applied thereto. In more detail, in FIG. 1c, reference numeral 15 designates a MgO/TiO/PZT/Pd/CoPd/Pd layered structure portion, reference numeral 16 designates a MgO/TiO/Pt/PZT/Pd/CoPd/Pd layered structure portion, reference numeral 17 designates a portion to which a laser beam is transmitted, reference numeral 18 designates a MgO/TiO substrate, reference numerals 19 and 20 designate gold wires, and reference numeral 21 designates a MgO/TiO/Pt layered structure portion. FIG. 1d is an enlarged view of a dotted line section of FIG. 1c, wherein reference numeral 22 designates a Pt pad, and reference numeral 23 designates Pt electrode lines. FIG. 1e is an enlarged view of a dotted line section of FIG. 1d (see reference numeral 24).

In the present invention, in order to deposit CoPd alloy layers directly on top of the PZT substrate, an alloy film was put into an ultrahigh vacuum chamber and was grown with an electron-beam evaporator at 1.5 Å/min under a pressure of $1 \times 10^{-8}$ Torr. After a 15-Å-thick Pd capping layer was deposited to prevent oxidation, the chamber was vented to bond two Pt electrode pads with two external gold wires for applying voltage (see FIG. 1c). In order to examine whether the Pt electrodes were well connected, capacitance between the nearest neighboring Pt electrodes was measured via an impedance analyzer. The measured capacitance is in good agreement with the expected value calculated based on the electrode geometry and PZT characteristics.

Figure 2A:
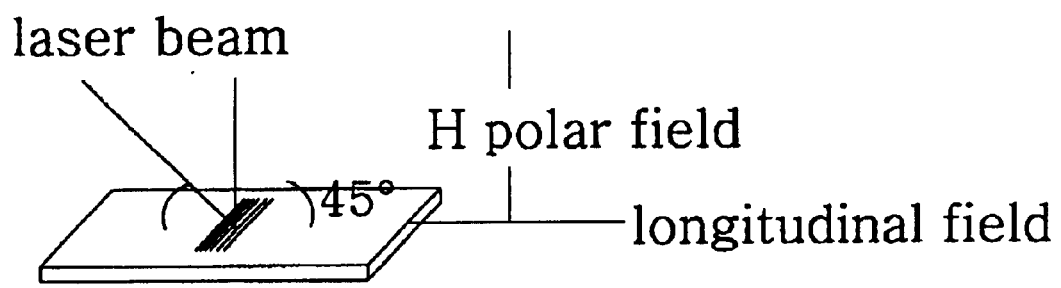
FIG. 2a is a view showing geometry for measuring longitudinal and polar Kerr signals in the hybrid system of the present invention.
Figure 2B:
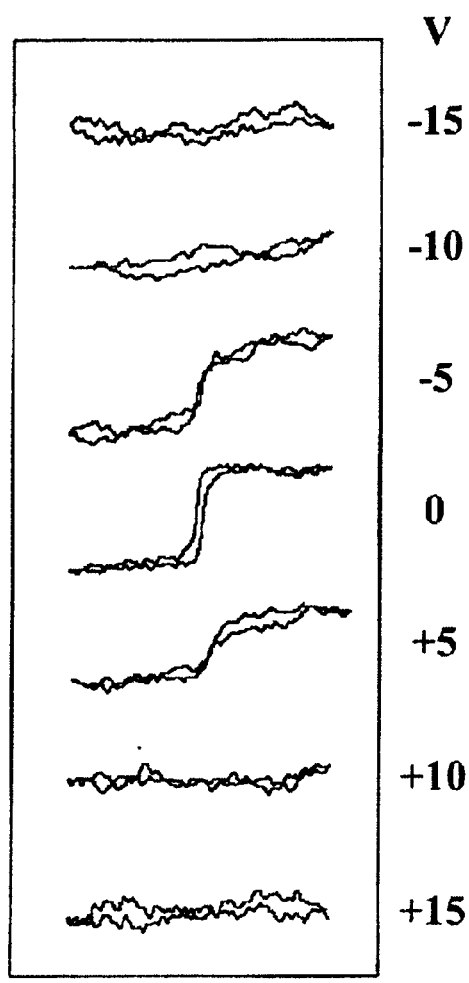
FIGS. 2b and 2c are views showing Kerr ellipticities and rotation magnetic hysteric curves differently measured according to the variations of voltage, respectively.
Figure 2C:
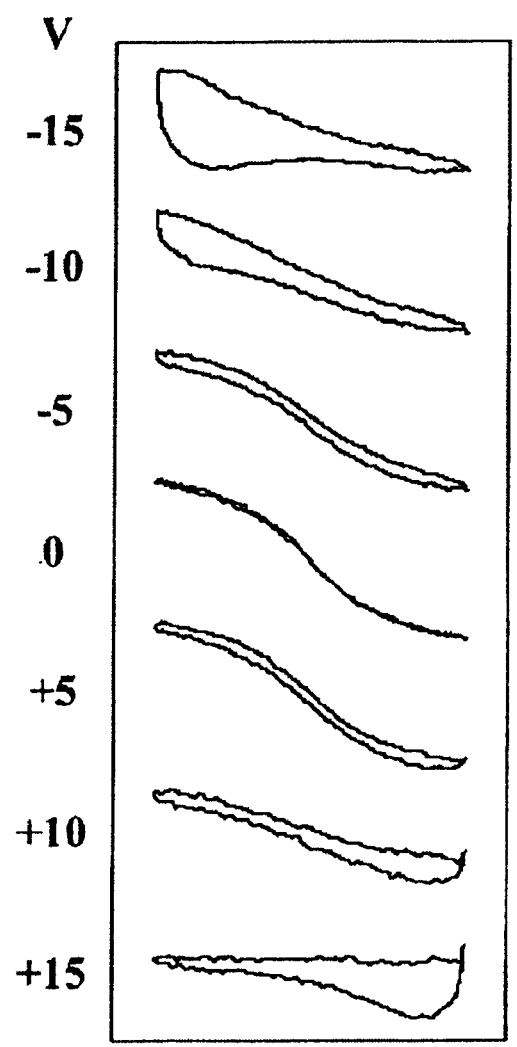

FIG. 2a shows the geometry to measure longitudinal and polar Kerr signals, where the magnetic field direction lying on the light scattering plane is parallel to the film plane for the longitudinal case and the magnetic field direction lying on the light scattering plane is perpendicular to the film plane for the polar case. FIGS. 2b and 2c show the magnetic hysteresis loops measured as a function of voltage, where the Kerr ellipticity and rotation are simultaneously measured. The longitudinal Kerr ellipticity and the polar Kerr rotation are illustrated in FIGS. 2b and 2c, respectively. Their different directional sensitivity to the measurement geometries as well as their intrinsic difference in size are showed.

As shown in the measurement geometries of FIG. 2a, spin switching according to change of voltage applied is measured through the longitudinal Kerr ellipticity and the polar Kerr rotation. The Kerr ellipticity at zero voltage shows a square loop with almost 90% remanence (see FIG. 2b), whereas the corresponding polar Kerr rotation shows a typical hard axis loop (see FIG. 2c). This indicates that the spontaneous magnetization lies on the film plane at zero voltage. As the applied voltage increases, the longitudinal ellipticity loops become slanted and then disappear at ±10 and ±15 while the corresponding polar rotation loops become more open and look like minor loops because of the limited strength of the magnetic field applied for the magnetization saturation. As described above, the phenomenon that a magnetization easy axis is switched according to the applied voltage can be apparently seen from changes in the shapes of the loops.

The Kerr rotation and ellipticity signals were measured with respect to both a varying voltage and a varying magnetic field under atmospheric pressure using the magneto-optical Kerr effects, where a magnetic field is applied along the film plane (longitudinal) and its normal (polar) direction by rotating the sample, as shown in FIG. 2a. For both cases, the field direction lies in the light scattering plane. A laser beam is incident at 45 degrees from the film plane, which has a size of about 0.7 mm in diameter, illuminates only a local area of magnetic films placed mostly on patterned Pt electrodes. Here, the Kerr ellipticity and rotation were observed through the reflected intensity by separating the first and second harmonics of a photo-elastic modulator. The spin switching phenomenon caused by a magnetic field or voltage can be observed by measuring both signals at the same time.

Figure 3A:
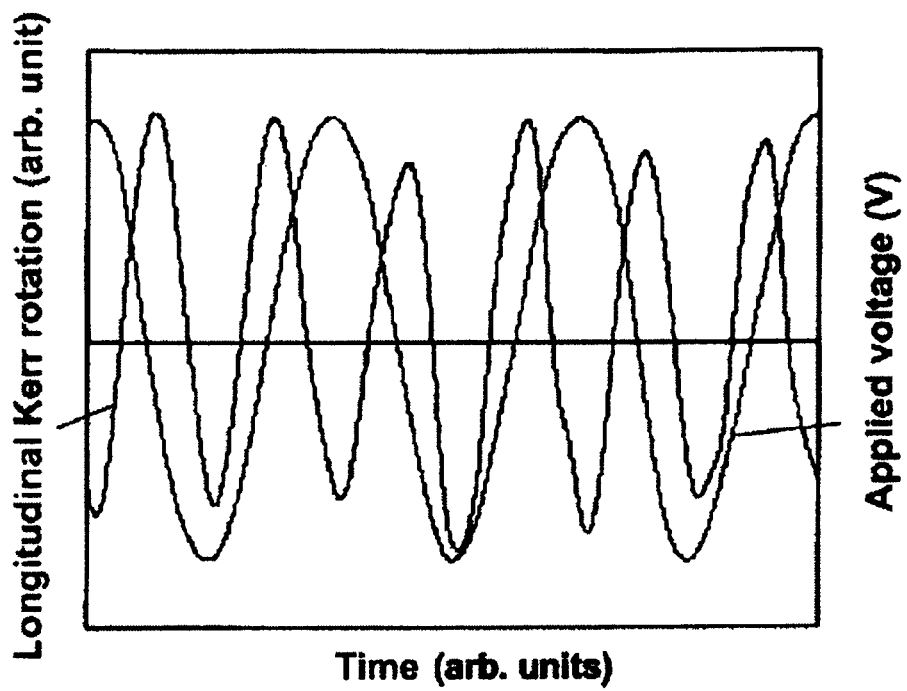
FIGS. 3a and 3b are graphs showing the variations of longitudinal and polar Kerr signals according to voltage having various sine waveforms in the range of ±10 V at a frequency of 0.5 Hz, respectively.
Figure 3B:
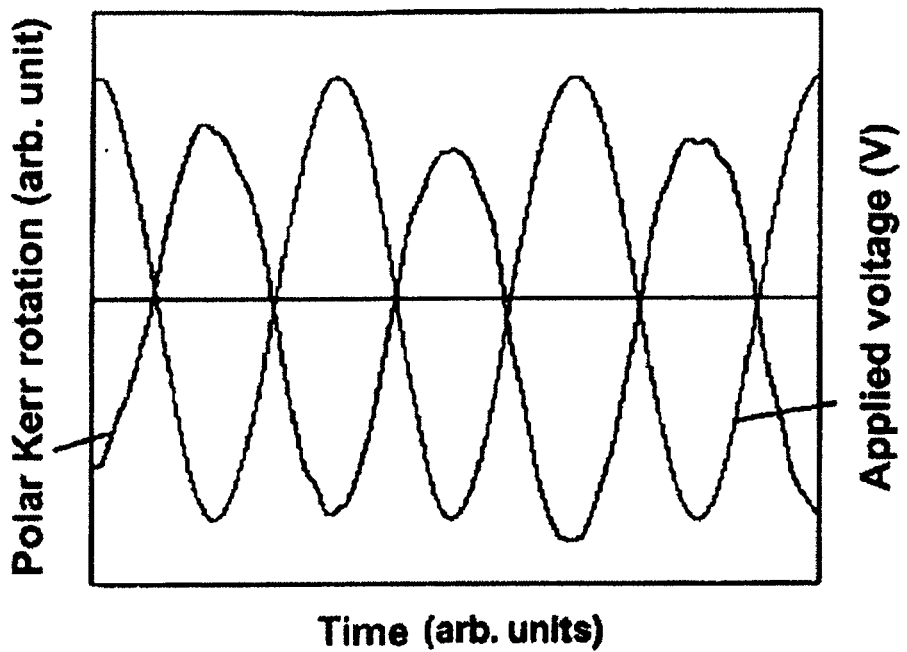
Figure 3C:
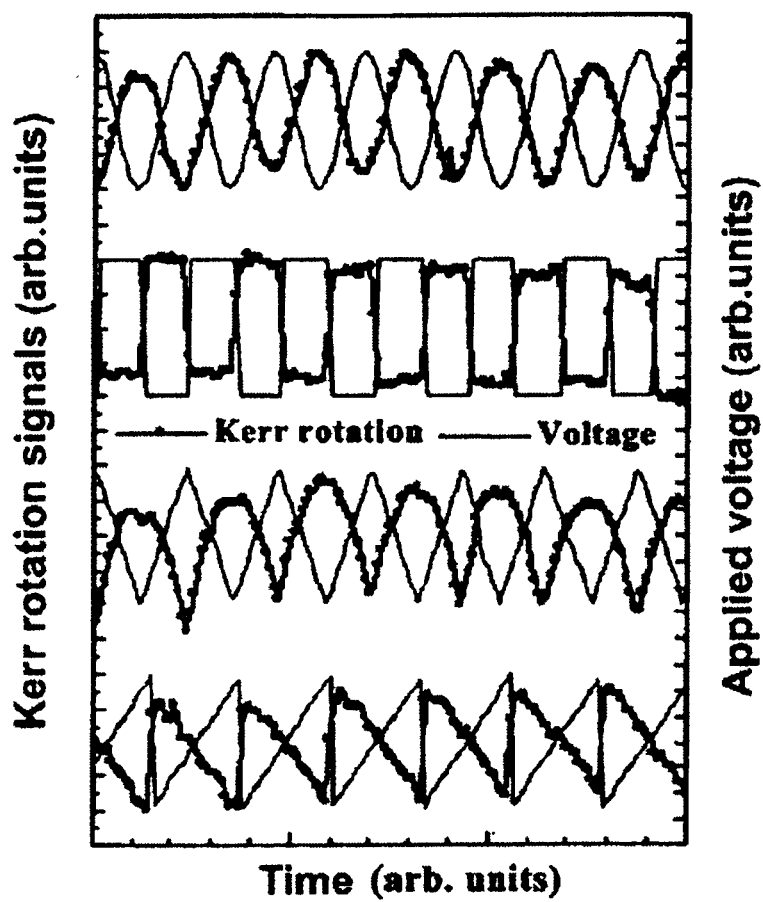
FIG. 3c is a graph showing the variations of polar Kerr rotation signals according to voltage having various waveforms in the range of ±10 V at 0.5 Hz under an applied magnetic field of 150 Oe.
Figure 3D:
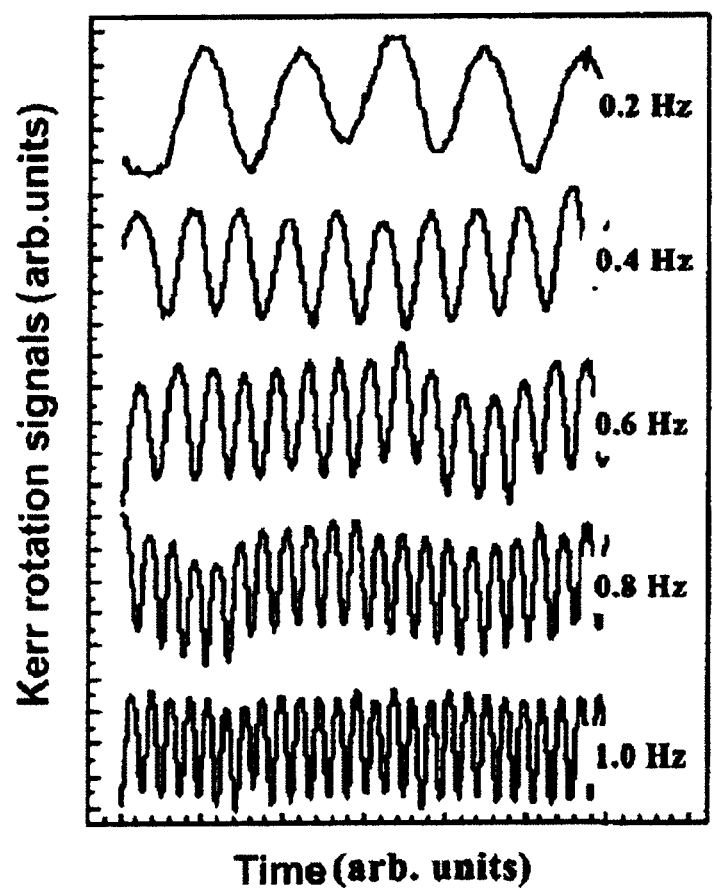
FIG. 3d is a graph showing the variations of polar Kerr rotation signals according to frequencies having various sine waveforms with voltage being modulated in the range of ±10 V.
Figure 3E:
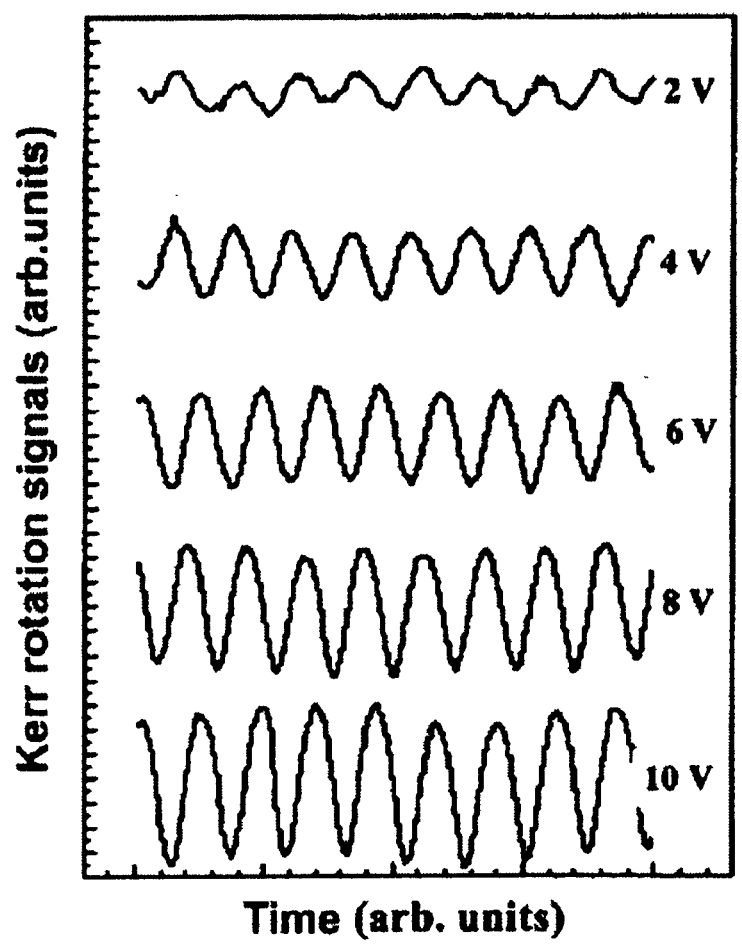
FIG. 3e is a graph showing the variations of polar Kerr rotation signals according to voltage amplitudes having various sine waveforms at 0.5 Hz.

FIGS. 3a and 3b are graphs showing Kerr signals according to voltage varying in the form of a sine waveform in the range of ±10 V at a frequency of 0.5 Hz, wherein longitudinal and polar signals are observed in magnetic fields of 0 Oe and 150 Oe, respectively. FIG. 3c is a graph showing the variations of polar Kerr rotation signals according to voltage having various waveforms in the range of ±10 V at 0.5 Hz under an applied magnetic field of 150 Oe, wherein thin lines designate the waveforms of applied voltage. FIG. 3d is a graph showing the variations of polar Kerr rotation signals according to frequencies each having a sine waveform with voltage being modulated in the range of ±10 V. FIG. 3e is a graph showing the variations of polar Kerr rotation signals according to voltage amplitudes having sine waveforms at 0.5 Hz.

As described above, longitudinal and polar Kerr rotation signals measured versus the sine wave modulation of voltage are shown in FIGS. 3a and 3b, respectively. The Kerr rotation signals exactly follow a waveform the same as that of the applied voltage ranging from −10 V to +10 V. The observed frequency of the longitudinal Kerr rotation is two times faster than that of the applied voltage, since the longitudinal Kerr loops show an even response with respect to the voltage. In contrast, that of the polar one is of a frequency the same as that of the voltage, since the polar Kerr loops are in odd response to the voltage. It should be noted that the variation of voltage induced the oscillations of the Kerr rotation signals. This apparently proves that voltage-controllable spin switching is possible in a reversible manner in the CoPd/PZT hybrid system.

The present invention investigates spin switching behaviors responding to the various waveforms of voltage ranging −10V to +10V at a frequency of 0.5 Hz or various frequencies and various voltage amplitudes. Observed Kerr rotation exactly follows the waveforms of the applied voltage and the frequency of the voltage in a reversible manner. As the size of the applied voltage is reduced, the amplitude of the Kerr rotation is also reduced. In FIGS. 3c, 3d and 3e, only polar cases are illustrated. The signals of the Kerr rotation were measured under the applied field of about 150 Oe, since signals at a zero magnetic field are small compared with those at a higher magnetic field, which is presented by the voltage dependence of magnetic hysteresis loops shown in FIGS. 2b and 2c. Kerr signals from a bare Pt electrode/PZT sample without the deposition of CoPt layers were measured, but Kerr signals are not observed in the hybrid system of piezoelectric/magnetic films. This clearly shows that the spin switching controlled by voltage in the hybrid system is not caused by any electro- and magneto-optical effects of the PZT itself, but is rather ascribed to spin-reorientation transition in CoPd alloy films by an inverse piezoelectric effect of the PZT substrate and an inverse magnetostrictive effect in the pure magnetic layer.

In accordance with experimental results for the present invention, the hybrid system of PZT/CoPd may be powerful technology for spin switching that can be controlled with voltage without the application of an external magnetic field. However, when voltage is zero, that is, power is removed, remnant magnetization was not showed yet. While power is removed, the presence of sufficient remnant magnetization is essential to nonvolatile memory devices. Accordingly, it is necessary to achieve spontaneous magnetization-hysteretic behavior with respect to voltage at a zero voltage. Optimizing the thickness and composition of the CoPd alloy film as well as searching for the appropriate electric field versus strain behavior of the piezoelectric layers can create the considerable voltage-driven hysteretic behavior of the spin switching. Additionally, if intervals between neighboring Pt electrode line become shorter, greater dipole polarization can be occurred by the applied or less voltage, thus considerable spin switching to perpendicular orientation is created. The more the intervals between the neighboring Pt electrode lines are reduced, the greater density and the lower required power are achieved.

In the meantime, Giant Magnetoresistance (GMR) effect can be employed as a readout means. This is because the noncollinear relationship of spontaneous magnetization directions between in-plane and out-of-plane easy axes can create considerable GMR. In order to achieve superior signals in an actual device, it is necessary to employ certain line materials having great magnetoresistance and magnetostriction constant. That is, ternary or more alloy line materials of Co, Fe, Ni, Pd, Pt, Au, Cu, W and the like may be used.

Figure 4A:
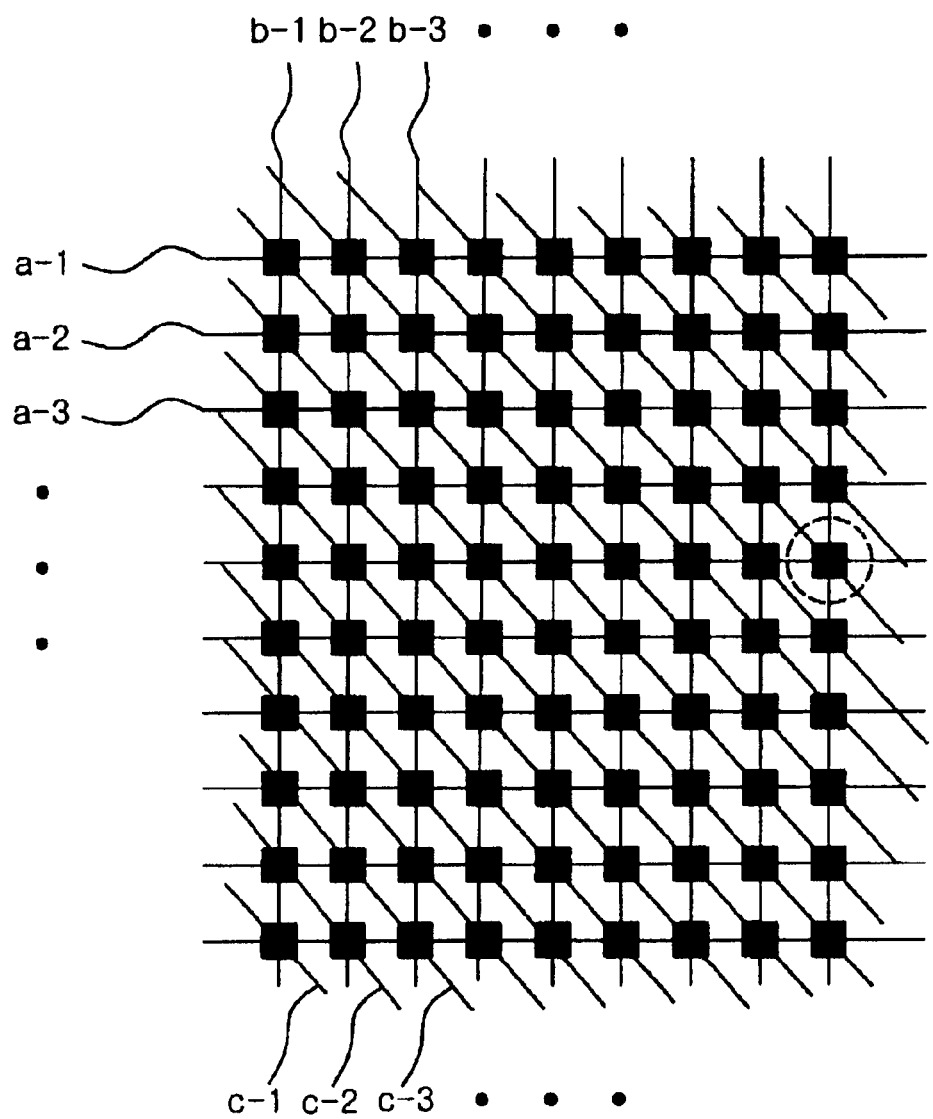
FIGS. 4a and 4b are views showing two types of memory cell array and address structures in the case where voltage is applied to a film-layered plane in vertical and horizontal directions.
Figure 4B:
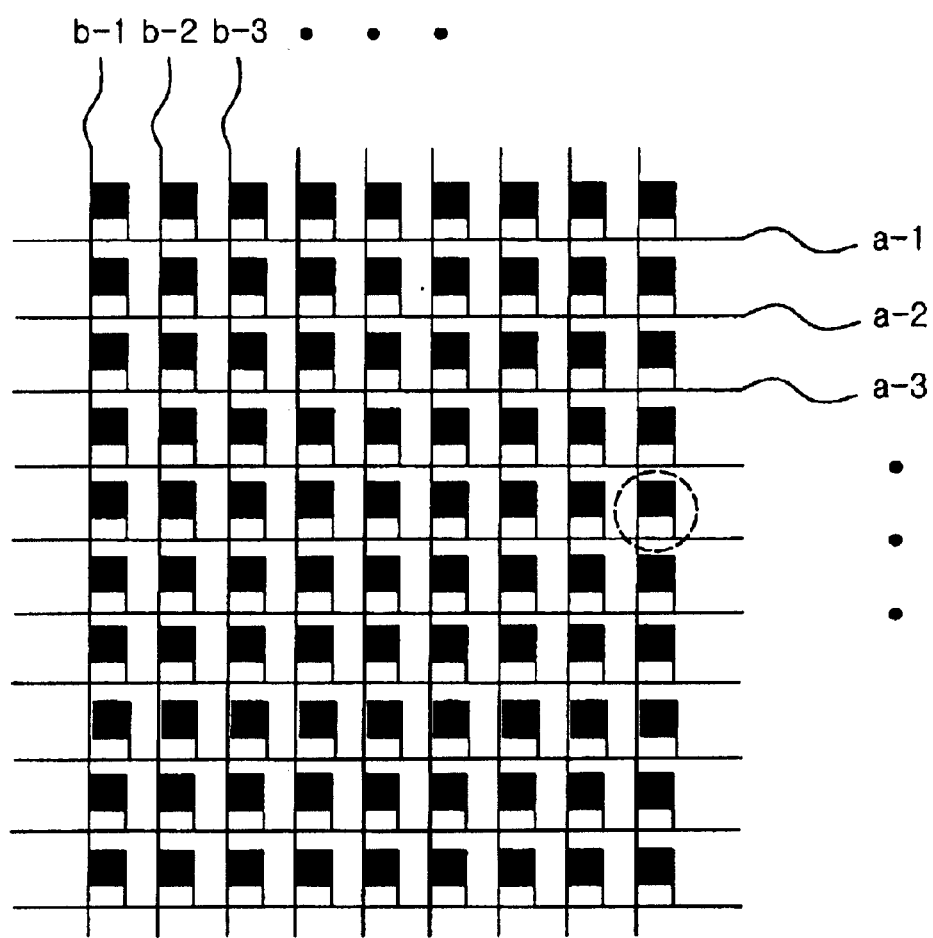

Hereinafter, a memory to which the spin switching driving method is applied is described. FIGS. 4a and 4b are views showing two types of memory cell array and addressing structures, respectively. A plurality of metallic electrode lines are arranged to apply voltages to respective cells, and the cells are disposed on the metallic electrode lines.

In the case of a cell array type 1 shown in FIG. 4a, when information is written, voltage is applied to each of corresponding cells using some of the electrode lines a and b that are connected to the cell. In contrast, when information is read, current is applied through some of the electrode lines "a" and "c" (diagonal electrode line) and resistance is measured using a magnetic resistor. Accordingly, the electrodes "a", "b" and "c" are paths through which voltage is applied to corresponding cells so as to write information and current is applied to corresponding cells so as to read information.

In the case of a cell array type 2 shown in FIG. 4b, voltage and current are applied to corresponding cells through electrode lines "a" and "b" so as to write and read information. In this structure, each of the electrode lines "a" and "b" are separated into a path for applying voltage and a path for applying current by an insulator. Consequently, four types of electrode lines exist in this structure. The detailed structure will be discussed later.

Figure 5A:
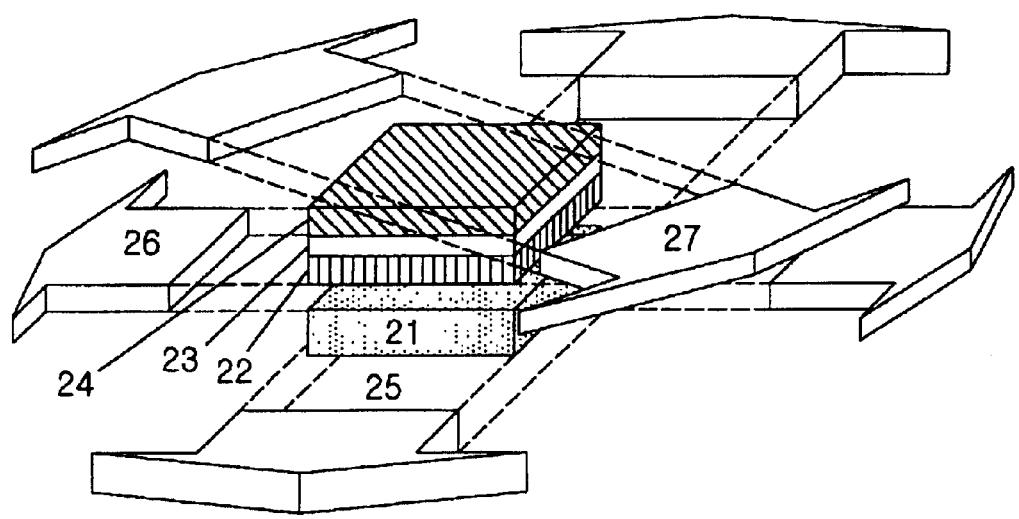
FIGS. 5a and 5b are views showing two types of memory cells each having a hybrid structure of piezoelectric/magnetic/electrode in accordance with the present invention.
Figure 5B:
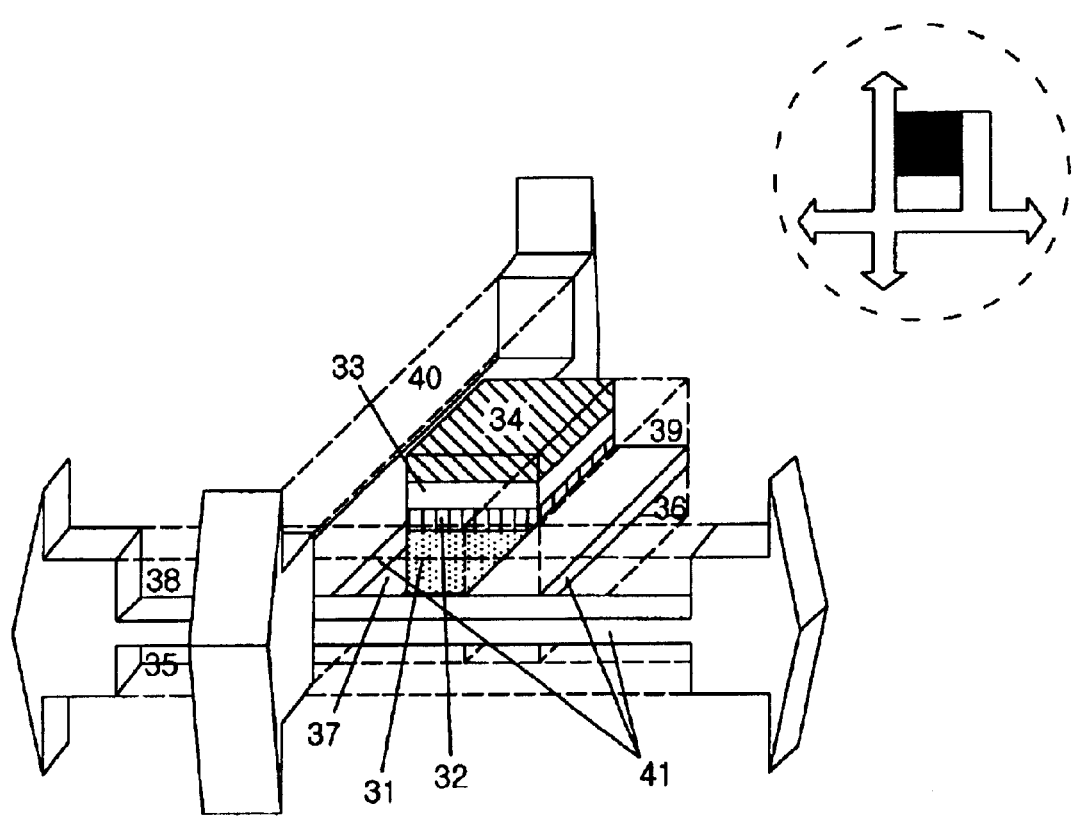

FIGS. 5a and 5b are diagrams showing the cell structures of MRAMs, which illustrate the memory cell surrounded by the dotted-line portion of FIG. 4a and the memory cell surrounded by the dotted-line portion of FIG. 4b in detail, respectively. As depicted in these drawings, each of the layered magnetic films is comprised of a free magnetic layer 22 or 32 that can be spin switched by the voltage of a piezoelectric layer 21 or 31, a fixed magnetic layer 24 or 34 in which a spin easy axis is fixed, and a non-magnetic layer 23 and 33 that suppresses the magnetic interaction of the two magnetic layers 21 and 14, or 31 or 34.

In the memory cell of type 1 shown in FIG. 5a, the vertical or horizontal spin direction of a free magnetic layer 22 is switched toward a horizontal or vertical plane respectively by applying voltage to a piezoelectric layer 21 through elements 25 and 26. Additionally, information can be read by applying current through elements 26 and 27 and reading a magnetoresistance value according to the relative spin directions of the free magnetic layer 22 and a fixed magnetic layer 24.

The memory cell of type 2 shown in FIG. 5b is different from the memory cell of type 1 shown in FIG. 5a in that the directions of voltage and current are not vertical directions but horizontal directions. In order to apply voltage to the piezoelectric layer 31, metallic electrode lines are separated from paths 38, 39 and 40 used to allow current to flow by insulating layers 41. Accordingly, when voltage is applied to the metallic line, current doesn't flow to the magnetic films, thus preventing a voltage drop phenomenon. When information is read, the relative spin directions of the two magnetic layers 32 and 34 can be read using magnetoresistance by applying current through the metallic electrode lines 38, 39 and 40. The memory cell viewed from above is illustrated in the dotted-line circle of FIG. 5b.

As described above, the present invention provides a voltage-driven spin direction switching method that is capable of localizing spin switching drive force on only cells on which information is written, by applying voltage instead of applying an external magnetic field, so a nonvolatile, ultrahigh density, low power magnetic memory having a capacity of 128 or more Mbit can be implemented in a MRAM. This is an essential information writing method for a MRAM having a capacity of 1 Gbit. Additionally, when the present invention is employed, the existing characteristics of a ferromagnetic material and manufacturing processes used for a FeRAM can be used. Additionally, the method of controlling the magnetization easy axis of ferromagnetic films using voltage according to the present invention can be applied to practical magnetic devices, such as magnetic sensors and digital reading heads, as well as nonvolatile MRAMs. Additionally, the present invention employs a magnetization easy axis itself, that is, vertical and horizontal anisotropy, instead of employing opposite spin directions on a single magnetization easy axis, so security of recorded information against an external magnetic field is assured. Additionally, the information writing method using magnetization easy axes can overcome superparamagnetism that may occur when the size of a magnetic material ranges from several nm to several tens of nm, thus improving the recording density of a memory device.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A nonvolatile, ultrahigh density, low power magnetic memory comprising an array of memory cells and using a method of controlling a magnetization easy axis of a ferromagnetic film using voltage, each of the memory cells comprising:

a piezoelectric layer comprised of a piezoelectric element;

a free magnetic layer disposed on the piezoelectric layer, wherein its magnetization easy axis is reversibly switched between in-plane and out-of-plane by stress induced by the piezoelectric layer to which voltage is applied;

a non-magnetic layer disposed on the free magnetic layer;

a fixed magnetic layer disposed on the non-magnetic layer, wherein its magnetization easy axis is fixed and the non-magnetic layer is interposed between the free magnetic layer and the fixed magnetic layer to suppress magnetic interaction between the two magnetic layers.

2. The nonvolatile, ultrahigh density, low power magnetic memory according to claim 1, wherein the memory cells are connected to one another by horizontal and vertical metallic electrode lines, and information is written by switching the magnetization easy axis of the free magnetization layer by applying voltage to the metallic electrode lines.

3. The nonvolatile, ultrahigh density, low power magnetic memory according to claim 2, wherein information is read out by reading the relative spin directions of the free and fixed magnetic layers in such a way as to apply current to the metallic electrode lines and read magnetoresistance values according to the relative spin direction of the two magnetic layers.

4. The nonvolatile, ultrahigh density, low power magnetic memory according to claim 3, wherein, when the spin directions of the free and fixed magnetic layers are vertical and horizontal respectively, and vice versa, the reading of the relative spin direction is carried Out by reading magnetoresistance values of the two magnetic layers and the difference between the values.

5. The nonvolatile, ultrahigh density, low power magnetic memory according to claim 4, further comprising diagonal metallic electrode lines, wherein information is read out by applying current to the diagonal and horizontal metallic electrode lines connected the memory cells, when voltage is applied in a vertical direction of the memory cell plane.

6. The nonvolatile, ultrahigh density, low power magnetic memory according to claim 4, further comprising insulators which divide each of the metallic electrode lines into a path for applying voltage and a path for applying current, in order to prevent flow of current through the magnetic layers, when the voltage is applied in a horizontal direction of the memory cell plane.

7. A method of writing information in a nonvolatile, ultrahigh density, low power magnetic memory using a method of controlling the magnetization easy axis of a ferromagnetic film using voltage, wherein a method using two perpendicular or noncollinear magnetization axes is employed instead of a method using two spin states having opposite directions in a single magnetization easy axis, so deletion of information is prevented in spite of instantaneous exposure to an external magnetic field greater than coercivity of the ferromagnetic film.

* * * * *

UNITED STATES PATENT AND TRADEMARK OFFICE
CERTIFICATE OF CORRECTION

PATENT NO. : 6,829,157 B2  
DATED : December 7, 2004  
INVENTOR(S) : Sang-Koog Kim et al.

It is certified that error appears in the above-identified patent and that said Letters Patent is hereby corrected as shown below:

<u>Title page,</u>
Item [73], Assignee, should be corrected to read:
-- Korea Advanced Institute of Science and Technology --.

Signed and Sealed this

Nineteenth Day of July, 2005

JON W. DUDAS
*Director of the United States Patent and Trademark Office*